(12) United States Patent
Takahashi et al.

(10) Patent No.: US 8,804,454 B2
(45) Date of Patent: Aug. 12, 2014

(54) WORD LINE SELECTION CIRCUIT AND ROW DECODER

(71) Applicant: Renesas Electronics Corporation, Kanagawa (JP)

(72) Inventors: Hiroyuki Takahashi, Kanagawa (JP); Masahiro Yoshida, Kanagawa (JP); Noriaki Takeda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/741,647

(22) Filed: Jan. 15, 2013

(65) Prior Publication Data

US 2014/0029329 A1 Jan. 30, 2014

Related U.S. Application Data

(63) Continuation of application No. 12/773,404, filed on May 4, 2010, now Pat. No. 8,379,474.

(30) Foreign Application Priority Data

May 27, 2009 (JP) ................................ 2009-127676
Feb. 10, 2010 (JP) ................................ 2010-027902

(51) Int. Cl.
*G11C 8/08* (2006.01)
(52) U.S. Cl.
USPC ................................ 365/230.06; 365/185.23
(58) Field of Classification Search
USPC ........................ 365/230.06, 185.23
See application file for complete search history.

(56) References Cited

U.S. PATENT DOCUMENTS

| | | | |
|---|---|---|---|
| 5,309,402 A | 5/1994 | Okazawa | |
| 5,793,695 A | 8/1998 | Kohno | |
| 5,825,714 A | 10/1998 | Kohno | |
| 5,838,629 A | 11/1998 | Kohno | |
| 6,002,635 A | 12/1999 | Matano | |
| 6,031,757 A | 2/2000 | Chuang et al. | |
| 6,044,035 A | 3/2000 | Kohno | |
| 6,141,291 A | 10/2000 | Kohno | |
| 6,160,751 A | 12/2000 | Tomishima | |
| 6,160,752 A | 12/2000 | Kohno | |
| 6,233,198 B1 | 5/2001 | Choi | |
| 6,269,047 B1 | 7/2001 | Kohno | |
| 6,445,622 B1 | 9/2002 | Hirano | |
| 6,603,683 B2 | 8/2003 | Hsu et al. | |
| 6,629,047 B1 | 9/2003 | Guliani et al. | |
| 6,944,081 B2 | 9/2005 | Takahashi et al. | |
| 8,379,474 B2 * | 2/2013 | Takahashi et al. | ....... 365/230.06 |
| 2001/0003511 A1 | 6/2001 | Taura et al. | |

(Continued)

FOREIGN PATENT DOCUMENTS

| | | |
|---|---|---|
| JP | 7-254275 A | 10/1995 |
| JP | 11-86543 A | 3/1999 |
| JP | 2003-7062 A | 1/2003 |
| JP | 3838892 B2 | 8/2006 |

*Primary Examiner* — Hoai V Ho
*Assistant Examiner* — Jay Radke
(74) *Attorney, Agent, or Firm* — Foley & Lardner LLP

(57) ABSTRACT

A first exemplary aspect of the present invention is a word line selection circuit where address decode signals composed of a power supply voltage and a first voltage lower than a ground voltage are input, and that a word line selection signal composed of the first voltage and a second voltage higher than the power supply voltage is output not via a level shift circuit according to the address decode signals.

8 Claims, 14 Drawing Sheets

(56) References Cited

U.S. PATENT DOCUMENTS

| | | |
|---|---|---|
| 2002/0036923 A1 | 3/2002 | Chung et al. |
| 2002/0141249 A1 | 10/2002 | Tedrow et al. |
| 2003/0021150 A1 | 1/2003 | Park |
| 2004/0001386 A1 | 1/2004 | Park |
| 2006/0092750 A1 | 5/2006 | Jeon et al. |
| 2007/0217280 A1 | 9/2007 | Kumala |

\* cited by examiner

WORD LINE SELECTION CIRCUIT AND ROW DECODER

CROSS-REFERENCE TO RELATED PATENT APPLICATIONS

Japan Priority Application 2009-127676, filed May 27, 2009 including the specification, drawings, claims and abstract, is incorporated herein by reference in its entirety. Japan Priority Application 2010-027902, filed Feb. 10, 2010 including the specification, drawings, claims and abstract, is incorporated herein by reference in its entirety. This application is a Continuation of U.S. application Ser. No. 12/773,404, filed May 4, 2010, incorporated herein by reference in its entirety.

BACKGROUND OF THE INVENTION

1. Field of the Invention

The present invention relates to a word line selection circuit that selects a word line of a semiconductor memory device, and to a row decoder.

2. Description of Related Art

Regarding a word line selection circuit of a semiconductor memory device, circuits are known such as those disclosed in Japanese Patent No. 3838892 and Japanese Unexamined Patent Application Publication No. H07-254275. A schematic configuration and an operation of the related semiconductor memory device will be explained with reference to FIGS. 12 and 13. In FIG. 12, address signals that select word lines are applied to terminals 21 to 23. An address buffer 26 buffers address signals A0 to A10 which are applied at different times to the terminals 21 to 23, and outputs the buffered address signals. A pre-decoder 30 is connected to the address buffer 26, decodes address data A0 and A1 to output them as a 4-bit signal SSD, decodes address data A2 to A9 in two bit groups in similar fashion to A0 and A1, and furthermore, outputs a signal AS generated by amplifying address data A10 and an inverted signal /AS thereof. Subsequently, a main decoder 60 is connected to the pre-decoder 30, and receives the outputs generated by decoding the address data A2 to A9. The main decoder 60 further decodes the outputs from the pre-decoder 30, and supplies them to first word decoders 70 and 80. The first word decoders select a word line MWL of a memory cell array based on the outputs of the main decoder 60, and then activate it.

Here, the first word decoders 70 and 80 are composed of sub-decoders 71 to 84. FIG. 13 shows a configuration of the sub-decoder. As shown in FIG. 13, the sub-decoder is provided with 64 three-input NAND gates NG0 to NG63 and drivers DV0 to DV63 that perform level conversion and amplification of outputs of the respective NAND gates NG0 to NG63.

Each of the drivers DV0 to DV63, as shown in FIG. 13, is composed of a level conversion circuit 131, P channel FET 132, and N channel FET 133. An output of the level conversion circuit 131 is applied to each gate of the FETs 132 and 133. A boosted boost voltage Vbt is supplied to the level conversion circuit B1 and to a source of the FET 132. Drains of the FETs 132 and 133 are connected to each other, and a source of the FET 133 is grounded. According to such a configuration, the driver circuits DV0 to DV63 output the boosted voltage Vbt when the outputs of the NAND gates NG0 to NG63 are "0", while they output a ground potential when they are "1."

However, in an inverter circuit in which a high voltage is applied to the source of the P channel FET as shown in FIG. 13, as described in Japanese Unexamined Patent Application Publication No. H07-254275 (paragraph 0004), a control signal input into a common gate of an inverting buffer needs to be a control signal of VPP (the H level of the control signal is VPP) (Note that a boosted VPP described herein is synonymous with the aforementioned boost voltage Vbt.).

The reason is that in a case where the PMOSFET 132 is controlled by a control signal of VCC (the H level of the control signal is the VCC), when the H level (VCC) is input into the gate, there occurs a disadvantage that the PMOSFET 132 is not completely turned off since the source voltage is the VPP. Hence, a signal that controls the gate of the PMOSFET needs to be the control signal of the VPP, but since the outputs of the decoder are control signals of the VCC, it is necessary to convert a signal level from the VCC into the VPP. For this reason, it is necessary to provide a level conversion circuit between a row decoder and the PMOSFET.

However, since a level conversion circuit should be provided for each word line in the configurations shown in FIGS. 12 and 13, a number of level conversion circuits are needed. If the level conversion circuits are provided in addition to a decoder logic as described above, the number of transistors substantially increases, thus leading to the increase in an area of the word line selection circuit. Further, in order to provide the level conversion circuit for every word line, the level conversion circuits must be arranged by a cell pitch of memory cells in view of a chip layout. In addition, the number of circuit stages increases along with that of the level conversion circuits provided between the decoder logic and the inverting butler, thus preventing the speed-up of the circuit.

Here, if the level conversion circuits are arranged at a preceding stage to the row decoder, and the decoded signals themselves are made into boosted signals, the number of the level conversion circuits can be reduced. However, the larger becomes areas of the circuits driven by signals with large amplitude, the more power consumption increases.

It is to be noted that Japanese Unexamined Patent Application Publication No. H07-254275 discloses a configuration that among precharge signals and groups of address signals that control a row decoder, a level of only the precharge signals is converted to VPP and then they are input into the row decoder (FIGS. 1 and 2, and paragraph 0039 of Japanese Unexamined Patent Application Publication No. H07-254275). This configuration is shown in FIG. 14. Namely, a PMOSFET 14, whose drain is connected to a word line WL and whose source is to a boosted potential VPP, is provided at a row decoder 13 of a word line selection circuit 16. Only a precharge signal PRCH' that controls a gate of this PMOSFET 14 is then made into a boosted signal. Meanwhile, the groups of the address signals applied to gates of other FETs that constitute a decode logic (NAND gate) 15 of the row decoder 13 are held as VCC.

In the aforementioned configuration, level conversion is performed only to a control signal PRCH for precharge supplied to the gate of the PMOSFET 14 among the signals that control the row decoder 13, and then the PRCH is made into the control signal PRCH' of the VPP. This is because the control signal that controls an NMOSFET necessarily need not supply the control signal of the VPP although the control signal that controls the PMOSFET 14 certainly needs to be the control signal of the VPP. Namely, this is because if trying to control the PMOSFET 14 with the control signal of the VCC, the transistor is not completely turned off when the control signal is at the H level (VCC level). On the other hand, controlling the NMOSFET with the control signal of the VCC, the transistor is completely turned off when the control signal is at an L level (VSS level), so that there is no disadvantage in a circuit operation. Note that if the control signal of the NMOSFET is the control signal of the VPP, there is no problem in the circuit operation. According to this configuration, it is not necessary to provide the level conversion circuit for every row decoder 13, thus enabling to reduce the number of the level conversion circuits.

SUMMARY OF THE INVENTION

However, the present inventors have found a problem that since a level conversion circuit that converts the level of the control signals is separately needed in addition to a decoder circuit even according to the configuration of the above-described Japanese Unexamined Patent Application Publication No. H07-254275, the number of circuit stages increases. In addition, since the level conversion circuit is arranged at the preceding stage to the row decoder, a wire length and a parasitic capacitance increase. Further, necessity arises for securing a driving capability of the level conversion circuit in order to drive the increasing parasitic capacitance, and thus, scale of the level conversion circuit becomes large. Still further, since a precharge signal needs to be input regardless of selection/non-selection of a word line when accessing a memory, a consumption current becomes very large when the precharge signal is made into the control signal PRCH' of the VPP. Meanwhile, when trying to suppress the increasing consumption current, the control signal PRCH' of the VPP cannot be enlarged sufficiently, thus not being suitable for high-speed drive. Hence, there are still a lot of problems in achieving high integration, high speed, and low power consumption of a semiconductor memory device.

A first exemplary aspect of the present invention is a word line selection circuit where
  address decode signals composed of a power supply voltage and a first voltage lower than a ground voltage are input, and
  a word line selection signal composed of the first voltage and a second voltage higher than the power supply voltage is output not via a level shift circuit according to the address decode signals.

A second exemplary aspect of a word line selection circuit of the present invention including:
  a first stage having a variable resistance circuit composed of one transistor controlled by an address decode signal, said address decode signal being configured to have a first voltage swing; and
  a second stage coupled to said first stage, and outputting an output signal to a word line, said output signal being configured to have a second voltage swing larger than said first voltage swing.

According to this configuration, it becomes unnecessary to provide a level shift circuit for every word line that performs level shift of the control signals.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE PREFERRED EMBODIMENTS

Figure 1:
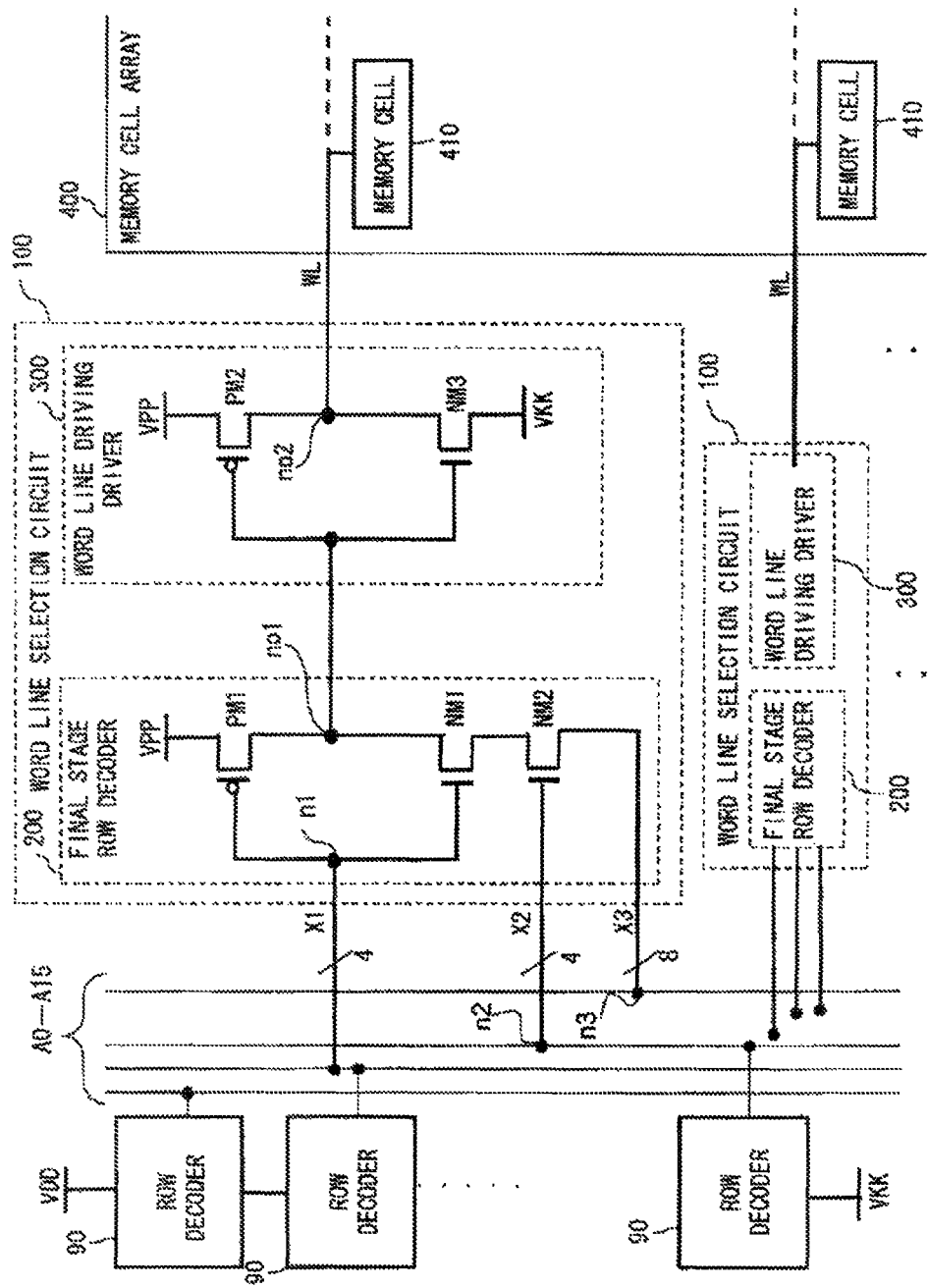
FIG. 1 shows a word line selection circuit in accordance with a first embodiment of the present invention.

Hereinafter, embodiments of the present invention will be shown in drawings and will be explained with reference to reference characters and numerals given to each component in the drawings.

First Embodiment

FIG. 1 shows a word line selection circuit 100 in accordance with a first embodiment of the present invention. In FIG. 1, reference numeral 200 is a final stage row decoder and reference numeral 300 is a word line driving driver (inverter circuit). Address signals X1, X2, and X3 decoded by a preceding stage row decoder 90 are input into the final stage row decoder 200. The preceding stage row decoder 90 is a circuit driven by a non-boosted power supply potential VDD, and the address signals X1, X2, and X3 output by the decoder are also control signals of VDD. It is to be noted that a low potential side of the row decoder 90 will be explained as a VICK boosted to be more negative than a ground potential, but a low potential side power source may be a ground power source GND.

The final stage row decoder 200 has achieved a circuit that combines a three-input decoder logic and boost level conversion. The final stage row decoder 200 is composed of three series-connected semiconductor transistors. Namely, it is provided with a PMOS transistor PM1 whose source is connected to a boosted power supply VPP, an NMOS transistor NM1 whose drain is connected to a drain of the PMOS transistor PM1, and an NMOS transistor NM2 whose drain is connected to a source of the NMOS transistor NM1. The power supply VPP connected to the source of the PMOS transistor PM1 is a boosted potential, and is also a potential generated by a predetermined VPP generating circuit (not shown). The gates of the PMOS transistor PM1 and the NMOS transistor NM1 are connected in common. Assume that this common gate is a first input node n1. In addition, assume that the gate of the NMOS transistor NM2 is a second input node n2, and that the source thereof is a third input node n3. Further, assume that a connection point of the drains of the PMOS transistor PM1 and the NMOS transistor NM1 is a first output node no1.

Subsequently, the final stage row decoder 200 decodes address signals input into the first input node n1, the second input node n2, and the third input node n3, and then controls the word line driving driver 300. Here, the address signal X1 is input into the first input node n1, the address signal X2 into the second input node n2, and the address signal X3 into the third input node n3.

The word line driving driver 300 is the inverter circuit, and is provided with a PMOS transistor PM2 and an NMOS transistor NM3 series-connected between a positive power supply VPP and a negative power supply VKK. Gates of the PMOS transistor PM2 and the NMOS transistor NM3 are connected to each other to be a common gate, and the first output node no1 is connected thereto. Assume that a connection point of drains of the PMOS transistor PM2 and the NMOS transistor NM3 is a second output node no2. This second output node no2 is connected to a word line WL, at which memory cells 410 that constitute a memory cell array 400 is provided.

Operations of the first embodiment provided with the above-described configuration will be explained. First, an operation will be explained when selecting the word line WL that has not been selected.

Figure 2:
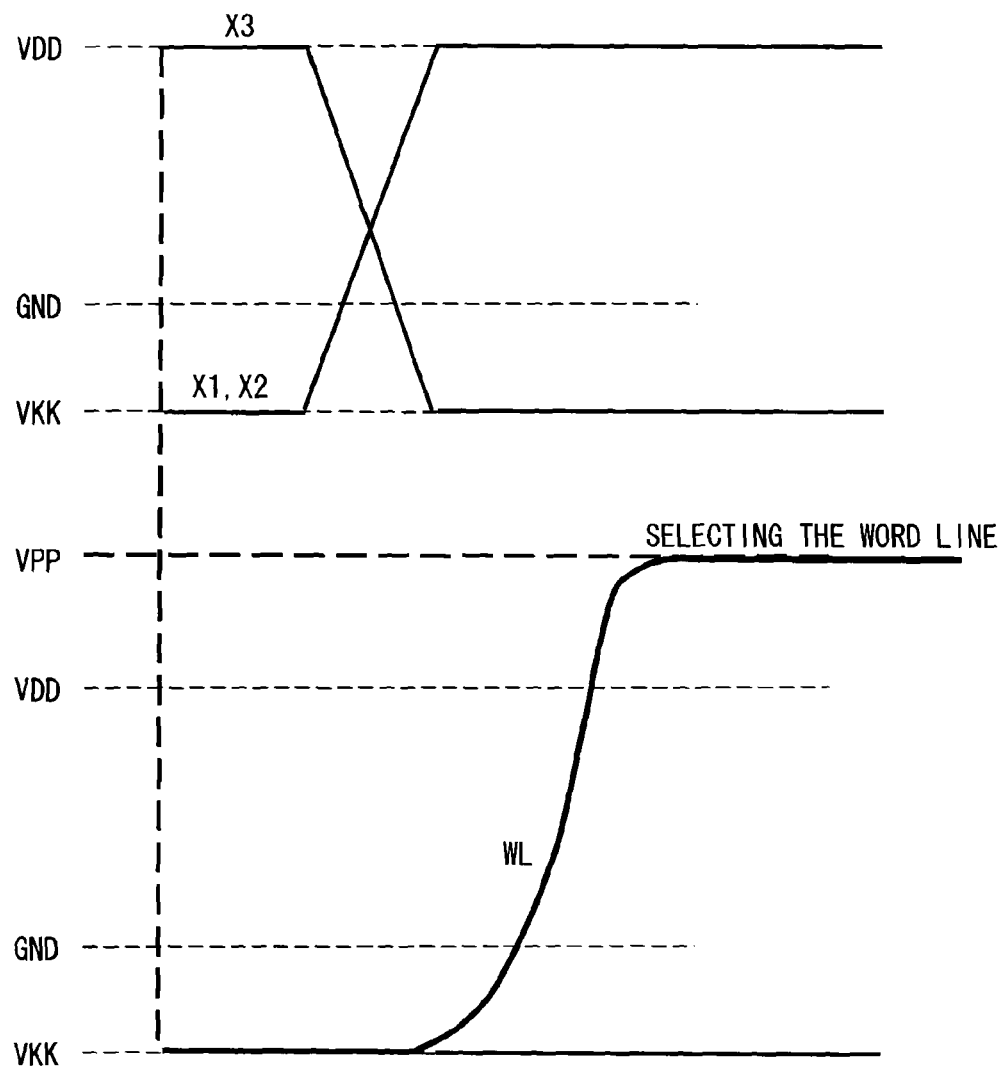
FIG. 2 illustrates an operation of the word line selection circuit when selecting a word line WL that has not been selected.

A timing chart at this time is shown in FIG. 2. The voltage of the address signals X1, X2, and X3 can swing between VDD and VKK. When the X1 and the X2 is at a low level (VKK) and the X3 at a high level (VDD), a word line has not been activated. Since the address signal X1 is at the low level at this time, the PMOS transistor PM1 is turned on strongly. Meanwhile, the NMOS transistor NM1 and the NMOS transistor NM2 are turned off. Hence, a potential of the first output node no1 becomes the high level (VPP). Since a high level voltage is then applied to the common gate of the word line driving driver 300, an output of the word line driving driver 300 is at the low level (VKK), and thus the word line WL is not activated (not selected).

When the address signals X1 and X2 become the high level (VDD) and the X3 changes to the low level (VKK) from the above-described state, the PMOS transistor PM1 is turned off, and both the NMOS transistor NM1 and NM2 are turned on. Here, a gate voltage of the PMOS transistor PM1 is a VPP-VDD, which is slightly exceeds a threshold value Vtp. Hence, the PMOS transistor PM1 is not completely turned off, but continues to be weakly on, and thus, it becomes a state of high resistance. Since the potential of the first output node no1 is decided by a relation between the VPP through a high resistor (PMOS transistor PM1) and the VKK through the NMOS transistor NM1 in an ON state, it becomes a sufficient low level. Since the first output node no1 changes to the low level as described above, the output of the word line driving driver 300 becomes the high level (VPP), and the word line is activated (selected).

Figure 3:
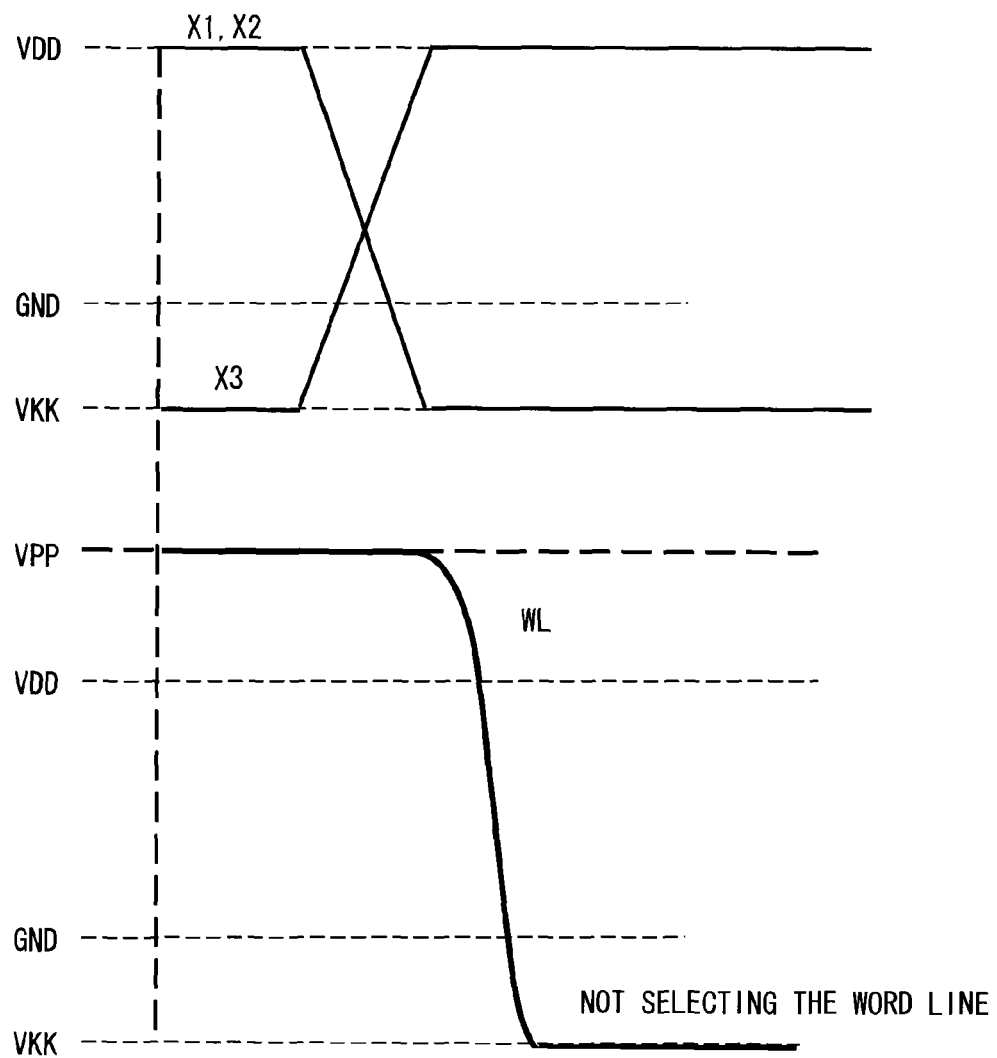
FIG. 3 illustrates an operation of the word line selection circuit when not selecting the word line WL that has been selected.

Next, when the word line is made not to be activated (not to be selected), the X1 and the X2 are made to be the low level (VKK), and the X3 to be the high level (VDD) from the aforementioned state. A timing chart at this time is shown in FIG. 3. Since the NMOS transistor NM1 and the NMOS transistor NM2 are then turned off while the PMOS transistor PM1 is turned on strongly as described above, the word line WL is not activated (not selected).

Figure 4:
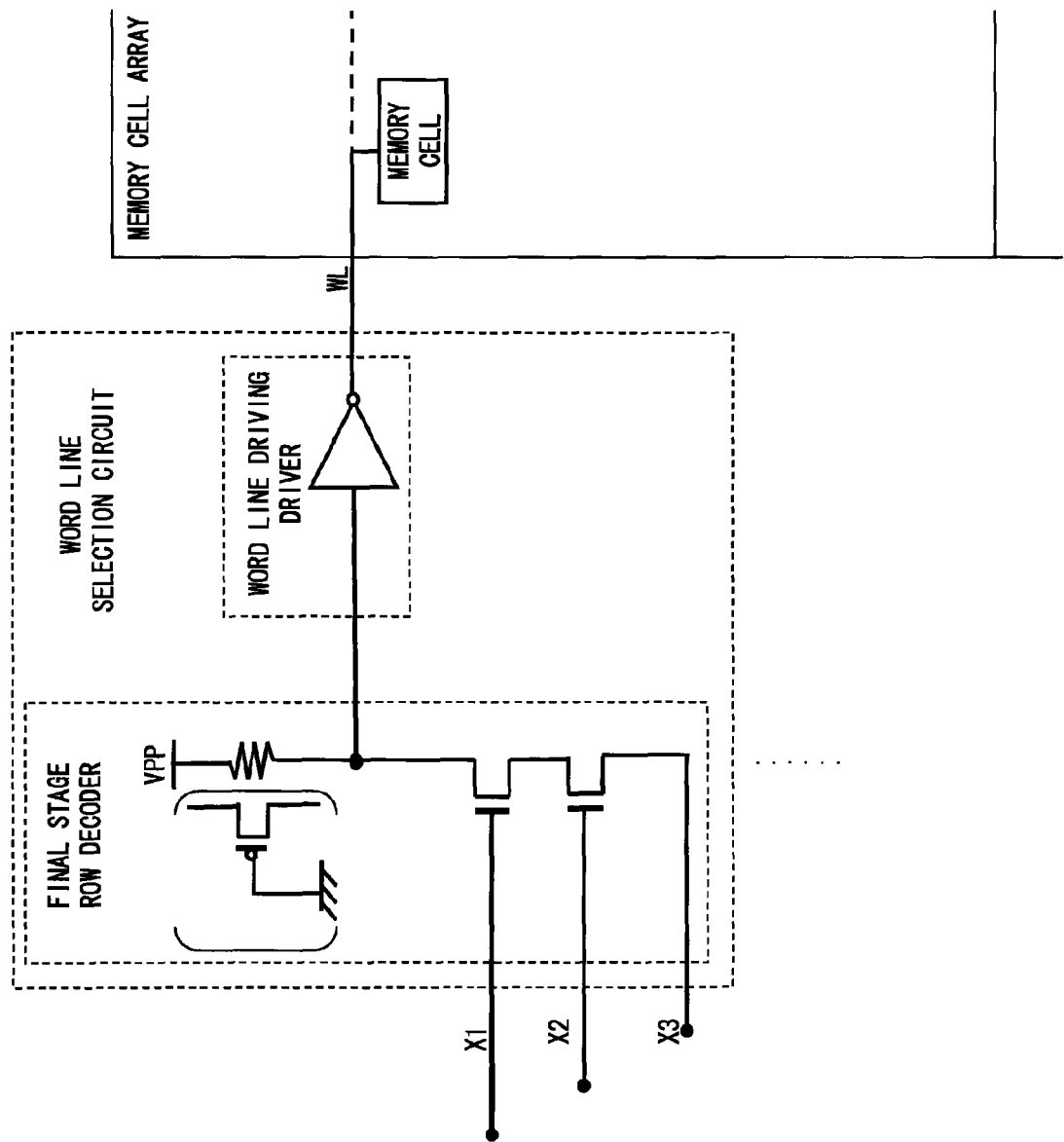
FIG. 4 shows a configuration of a word line selection circuit of a related art for comparative illustration.

In the aforementioned operations, the PMOS transistor PM1 functions as a variable resistor. Here, for example, an output of the preceding stage row decoder of the inverter circuit (word line driving circuit) is able to be changed by using a resistor or a normally-on PMOS transistor, as in the related art. This configuration is shown in FIG. 4 as one example. However, there is a problem that change of an output node is slow when a resistance value of the resistor or the PMOS transistor is fixed.

In this point, in the present embodiment, the PMOS transistor PM1 is strongly turned on (a resistance value thereof is almost 0) at the time of ON, and the value becomes high at the time of OFF. As a result of this, it becomes possible to operate the circuit at a high-speed, and the operations thereof can be made reliable. In addition, a pass-through current flows through the PMOS transistor PM1, but it is only a small amount, so that a problem of the pass-through current at the time of standby can be solved by making a word line driving operation to be a pulse. Further, according to this configuration, it becomes unnecessary to provide the level shift circuit for every word line that performs level shift of the control signals.

Modified Embodiment 1

Figure 5:
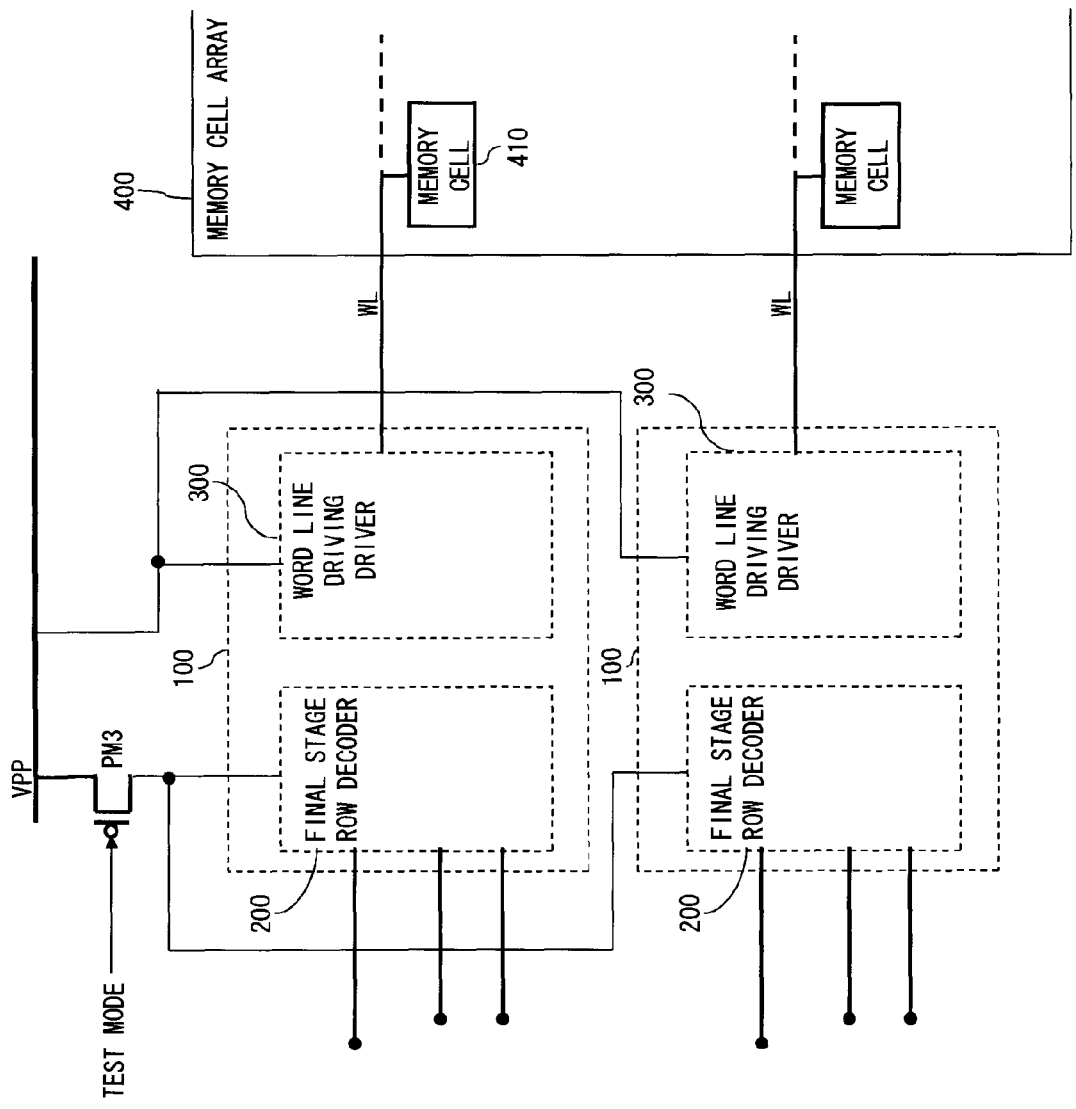
FIG. 5 shows a modified embodiment 1 of the present invention.

When examining the presence/absence of a leakage current of a memory, etc., memory cells may be multi-selected to make a test current flow for a time longer than usual. In such a case, a current that passes through the PMOS transistor PM1 increases. Consequently, as shown in FIG. 5, a PMOS transistor PM3 is provided between the power supply VPP and the final stage row decoder 200 as a switch ON/OFF controlled with a test signal. Subsequently, the PMOS transistor PM3 is turned off at the time of the test in which the memory cells are multi-selected. At this time, the NMOS transistors NM1 and NM2 are turned on, and the no1 becomes a low level. As a result of this, the pass-through current can be prevented from increasing.

Modified Embodiment 2

Figure 6:
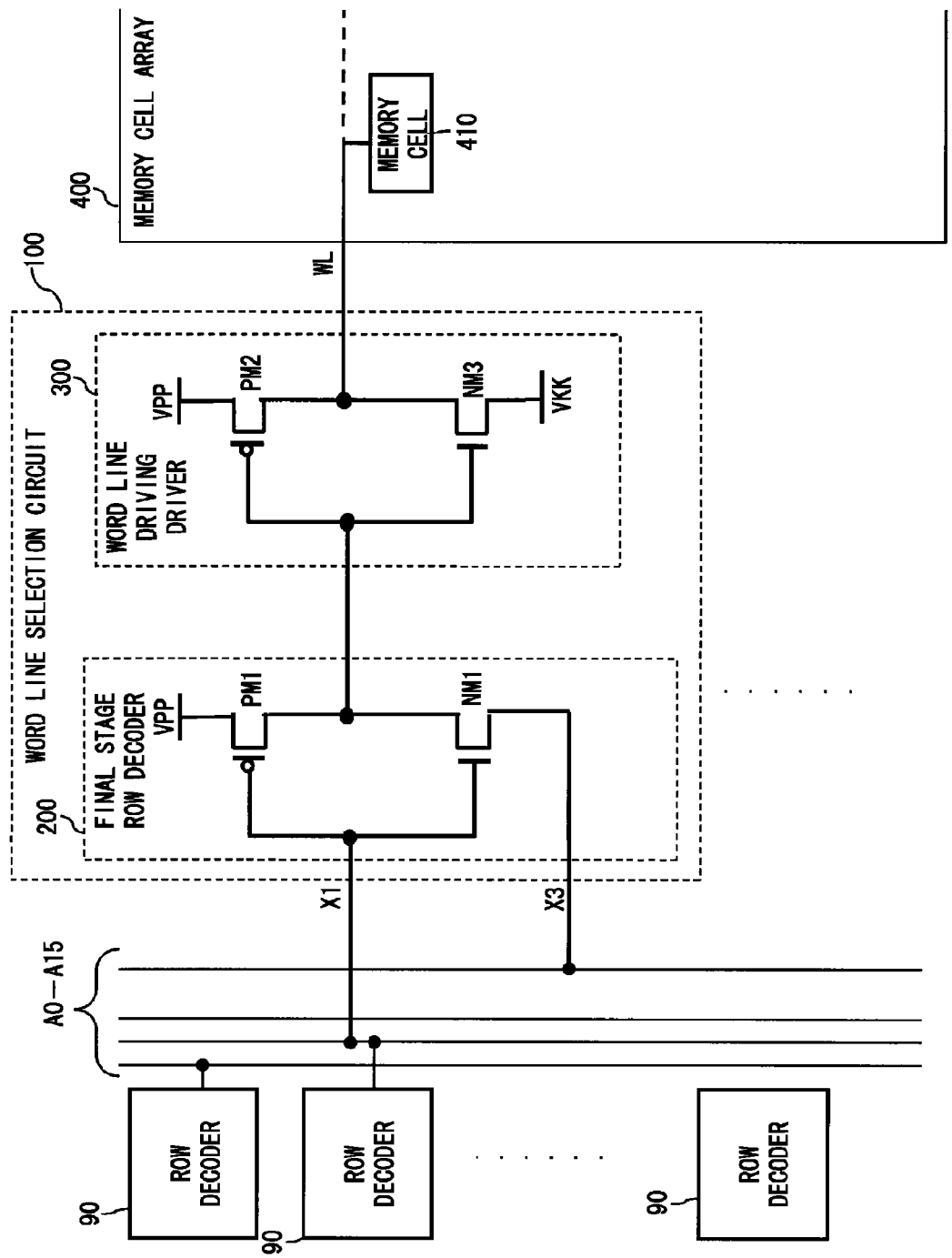
FIG. 6 shows a modified embodiment 2 of the present invention.

In the above-described first embodiment, the case is exemplified where the final stage row decoder 200 is the three-input logic, but as a matter of course, a two-input logic may also be used as shown in FIG. 6, and on the contrary, the circuit can be configured to decode more decoder signals.

Second Embodiment

In the above-described first embodiment, the word line selection circuit 100 is a modified AND logic circuit in which the node no2 is a high level when the address signals X1 and X2 are H (at the high level) and the address signal X3 is L (at a low level). In contrast with this, in a second embodiment, a word line is selected when the address signal X3 is at the high level, while it is not selected when the X3 is at the low level similar to the case of the address signals X1 and X2. As a result of this, types of the circuits and signal operations can be reduced, thus enabling to reduce the difficulty of designing and to improve design efficiency.

Figure 7:
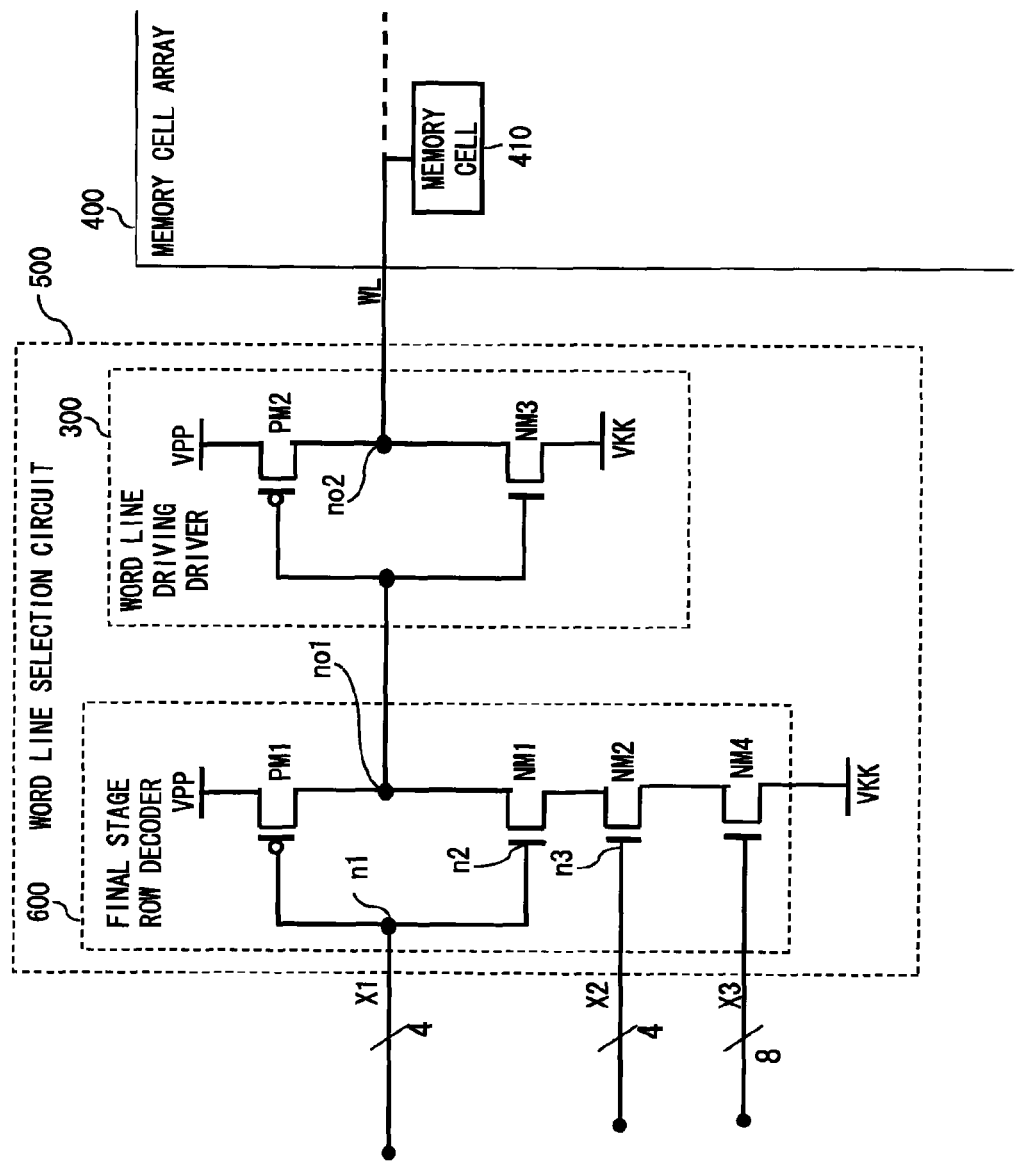
FIG. 7 shows a configuration of a second embodiment of the present invention.

A configuration of the second embodiment is shown in FIG. 7. A word line selection circuit 500 shown in FIG. 7 is provided with a final stage row decoder 600 and the word line driving driver 300. The word line driving driver 300 is the same as in the first embodiment. Here, an NMOS transistor NM4 is added in the final stage row decoder 600.

Specifically, the NMOS transistor NM4 is further connected in series to the source of the NMOS transistor NM2 shown in FIG. 1. Subsequently, a source of this NMOS transistor NM4 is connected to the VKK. The address signal X3 is input into a gate of this NMOS transistor NM4. As a result of this, a selection logic of the address signal X3 can be inverted. Hence, a word line is selected (activated) when the address signals X1, X2, and X3 are H (at the high level), while it is not selected (not activated) when the address signals X1, X2, and X3 are L (at the low level). According to this configuration, it becomes easier to design the circuit since operations thereof become simple although the number of elements increases.

Modified Embodiment 3

In the aforementioned embodiment, the case has been explained as an example where the L potential is the VKK boosted to be negative in the preceding stage row decoder 90. Here, means is required that makes a lowest potential to be the VKK from the GND in order to make the L potential to be the VKK. However, in the course of increased lowering of voltage along with the miniaturization of transistors in the future, there has been a tendency to make a negative potential of the word line WL shallow in order to prevent the increase of a leakage current from a memory cell transistor connected to the word line WL. If the VKK becomes shallow as described above, and then |VKK|<Vth (Vth is a threshold voltage of the NM3 or the NM4, for example) is established, the input signals (X1, X2, and X3) to the word line selection circuit 500 can be made into signals that swing between the VDD and the GND of a usual logic level. In this case, it becomes possible to constitute the row decoder 90 with a thin film transistor like a core power supply, thus enabling to achieve miniaturization and high speed of the elements, and power reduction.

Here, when the GND is used as a negative power supply of the row decoder 90, in the second embodiment, both cases are considered where the VKK is used and the GND is used as a negative power supply of the final stage row decoder 600.

Figure 8:
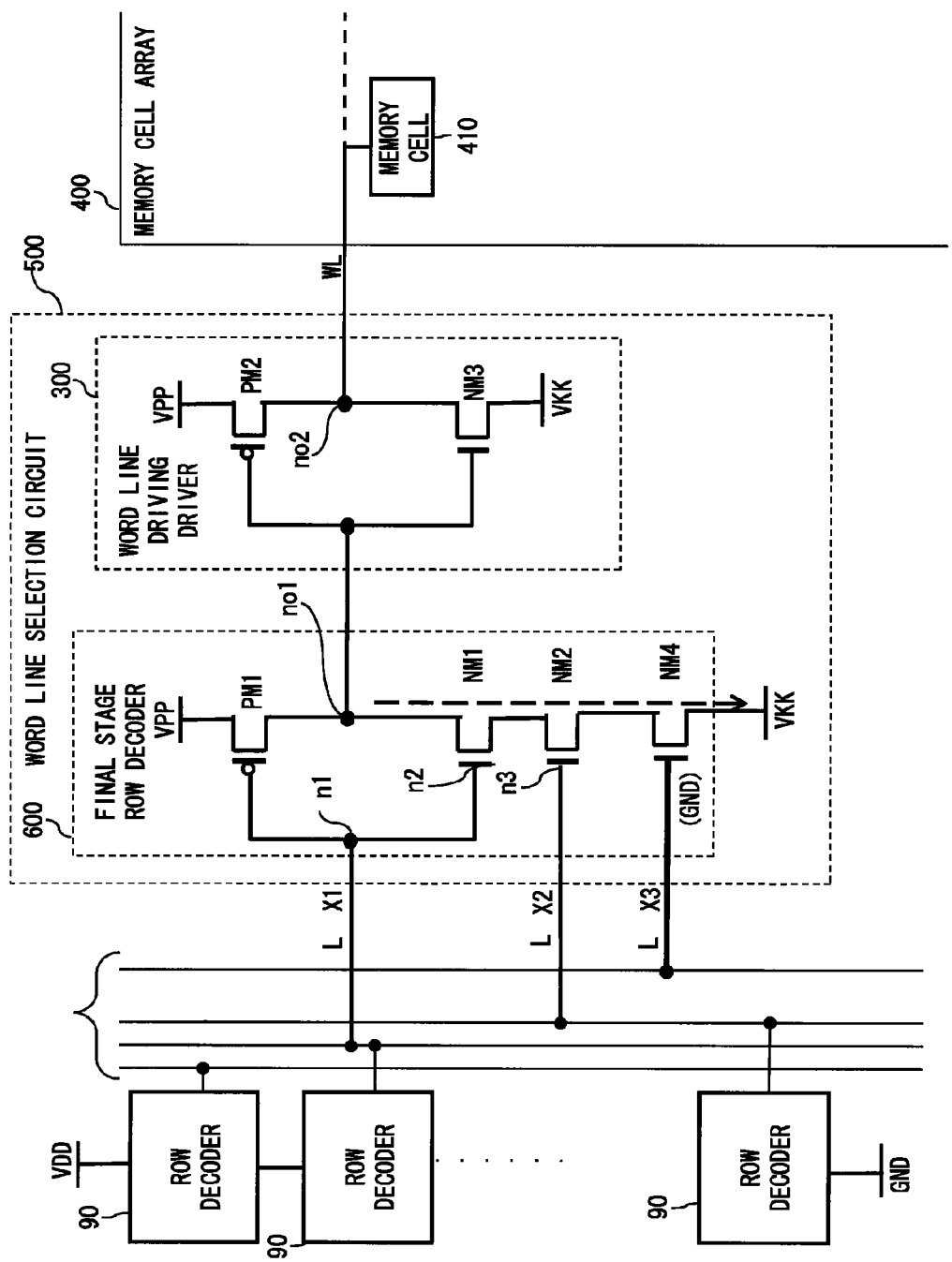
FIG. 8 shows a modified embodiment 3 of the present invention.

FIG. 8 shows the case where the VKK is used as the negative power supply of the final stage row decoder 600 when the GND is used as the negative power supply of the row decoder 90. In this case, when the address signals X1, X2, and X3 are at the low level (GND), there is a possibility that the NM4 is not completely turned off depending on a depth of |VKK|. Hence, an off leakage current that flows through the VKK is generated when the word line is not selected. If this off leakage current is a tolerable level, a configuration shown in FIG. 8 can be used.

Figure 9:
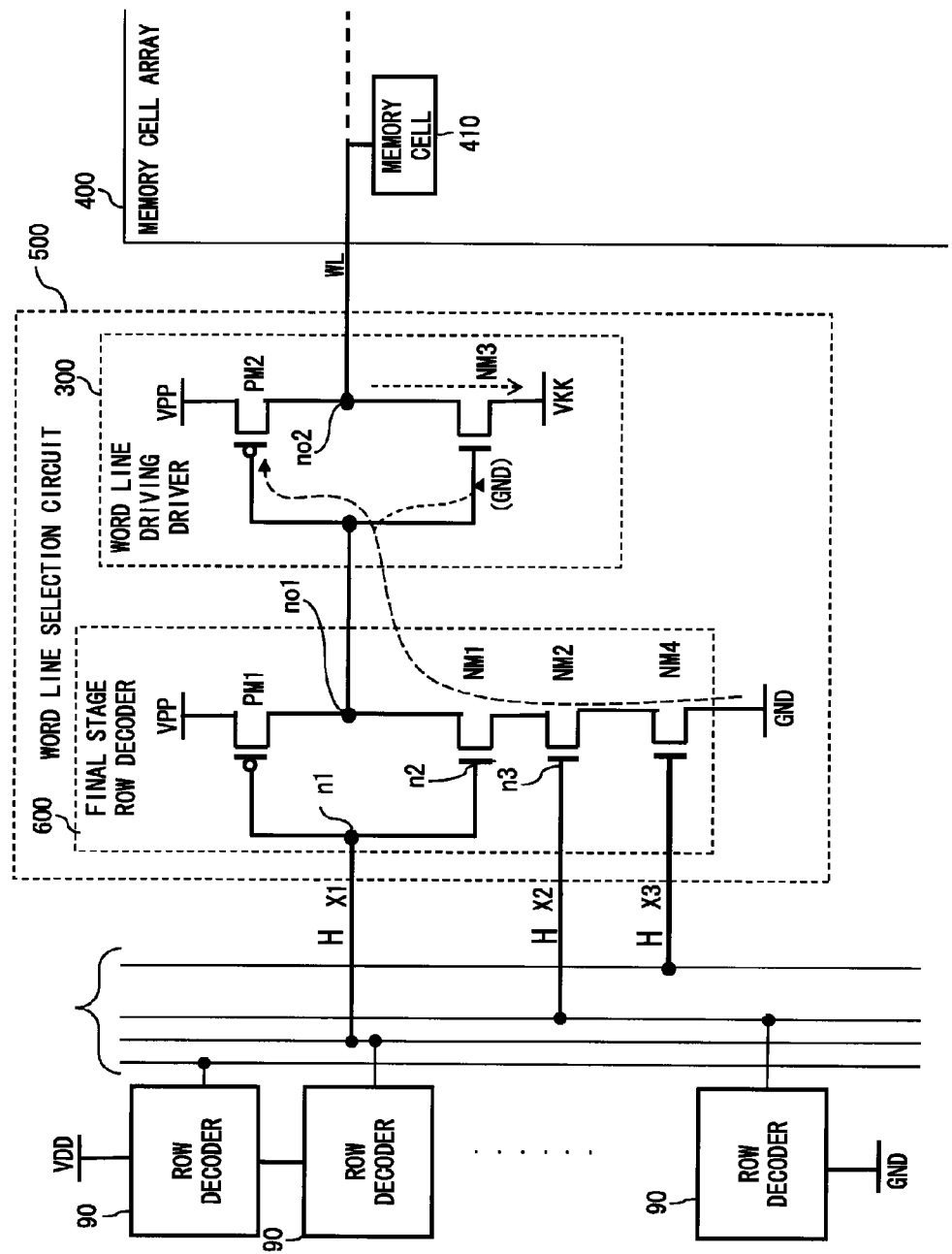
FIG. 9 shows the modified embodiment 3 of the present invention.

Meanwhile, FIG. 9 shows the case where the GND is used in place of the negative power supply of the final stage row decoder 600 when the GND is used as the negative power supply of the row decoder 90. In this case, when the address signals X1, X2, and X3 are at the high level, there is a possibility that the NM3 is not completely turned off depending on the depth of |VKK|. Hence, the off leakage current that flows through the VKK is generated when the word line is not selected. If fall of an H potential of the word line WL is a tolerance level, a configuration shown in FIG. 9 can be used. The configurations shown in FIGS. 8 and 9 can be suitably selected in accordance with the optimization of the design of the circuit.

Third Embodiment

Figure 10:
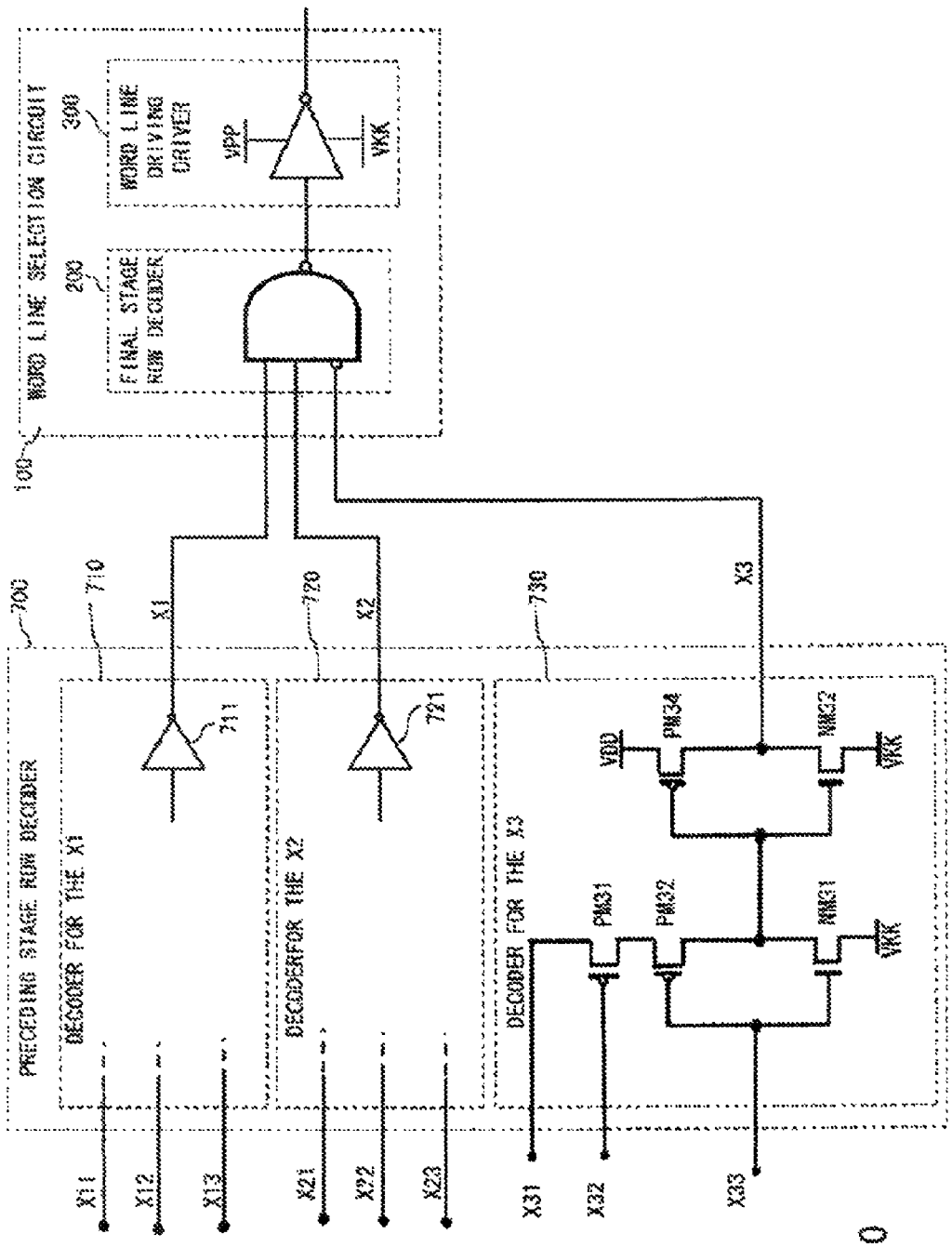
FIG. 10 shows a configuration of a third embodiment of the present invention.

In the above-described first embodiment, the word line selection circuit 100 has achieved final row decoding also including level conversion with small number of elements. Here, the configuration of the first embodiment can further be applied to the preceding stage row decoder to thereby make a configuration of multi-stage decoders. FIG. 10 shows a configuration of a third embodiment, and a preceding stage row decoder 700 is provided at a preceding stage to the word line selection circuit 100. It is to be noted that in FIG. 10, the final stage row decoder 200 and the word line driving driver 300 are the same as explained in the first embodiment.

As inputs of the final stage row decoder 200, there are included the address signals X1, X2, and X3. The preceding stage row decoder 700 decodes nine address signals X11 to X33, and outputs the address signals X1, X2, and X3. Hence, the preceding stage row decoder 700 is provided with a decoder 710 for the X1, a decoder 720 for the X2, and a decoder 730 for the X3.

Here, the word line selection circuit 100 is the modified AND logic circuit in which the node no2 is a high level when the address signals X1 and X2 are H (at the high level) and the address signal X3 is L (at the low level). Hence, as configurations of the decoders for the X1 and the X2, inverters 711 and 721 as driving buffers may be added to an output stage of the decoder 730 for the X3 to thereby invert the signals. Consequently, a configuration of the decoder 730 for the X3 is shown in FIG. 10, while the configurations of the decoders for the X1 and the X2 are omitted.

The address signal X3 is selected at the low level (VKK), while it is not selected at the high level (VDD). Hence, as the configuration of the decoder for the X3, the PMOS transistor and the NMOS transistor of the word line selection circuit 100 may be interchanged to each other, further, the highest potential VPP to the lowest potential VKK, and the lowest potential VKK to the highest potential VDD. The above-described interchange is specifically shown in FIG. 10. According to this configuration, the preceding stage row decoder 700 can also be composed of small number of elements to thereby be made into a suitable one for high-speed operation since it does not require a level shifter. As a result of this, the number of elements of a whole memory driver can also be reduced to thereby achieve high-speed operation.

Modified Embodiment 4

Figure 11:
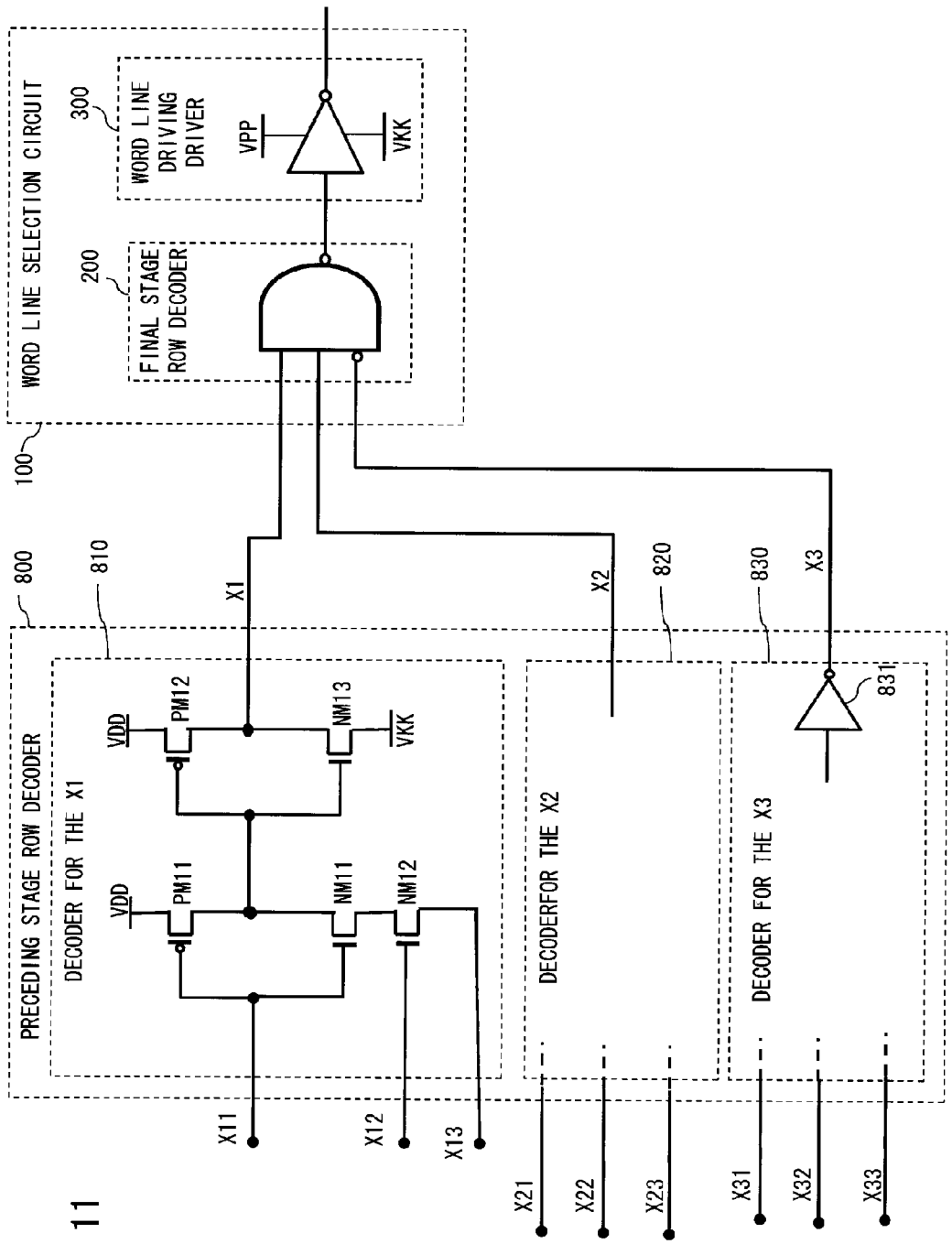
FIG. 11 shows a modified embodiment 4 of the present invention.
Figure 12:
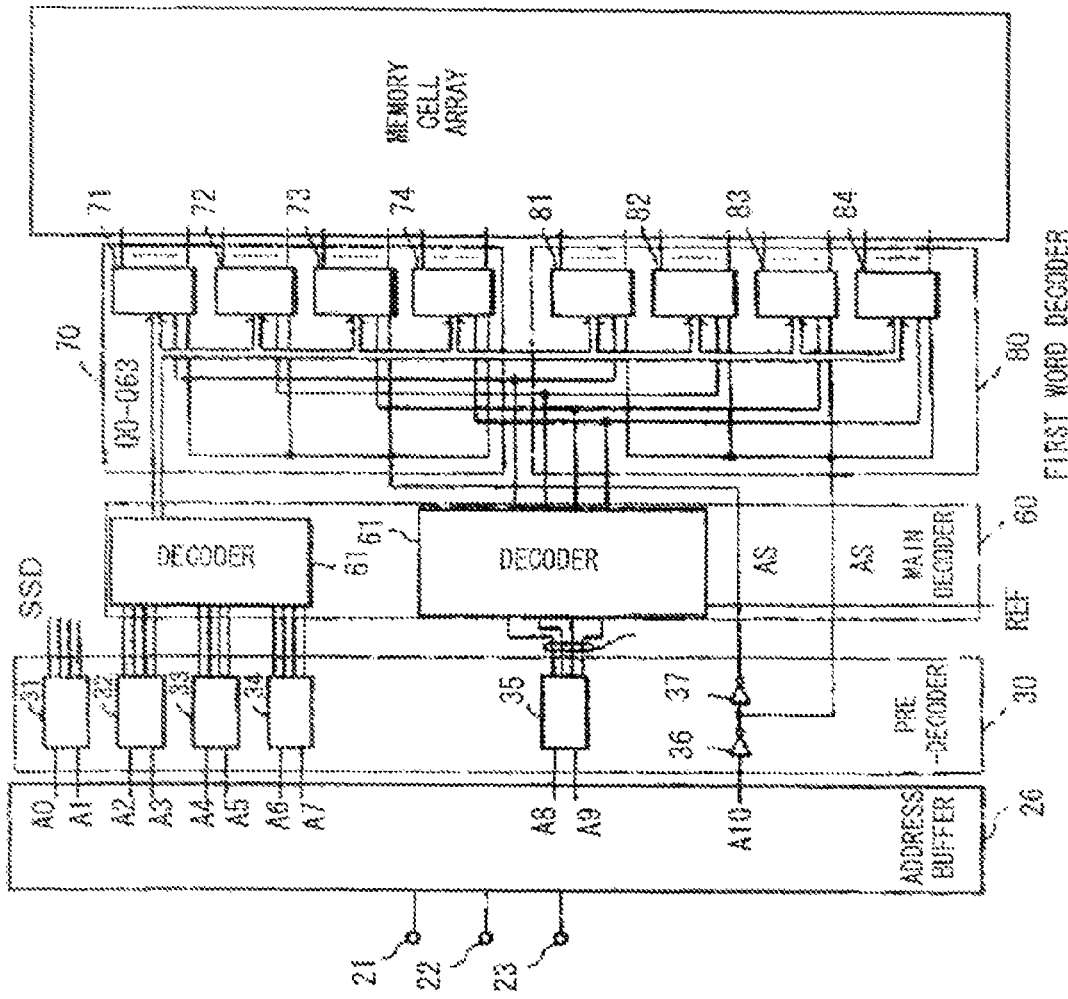
FIG. 12 shows a configuration of a word line selection circuit of a related art.
Figure 13:
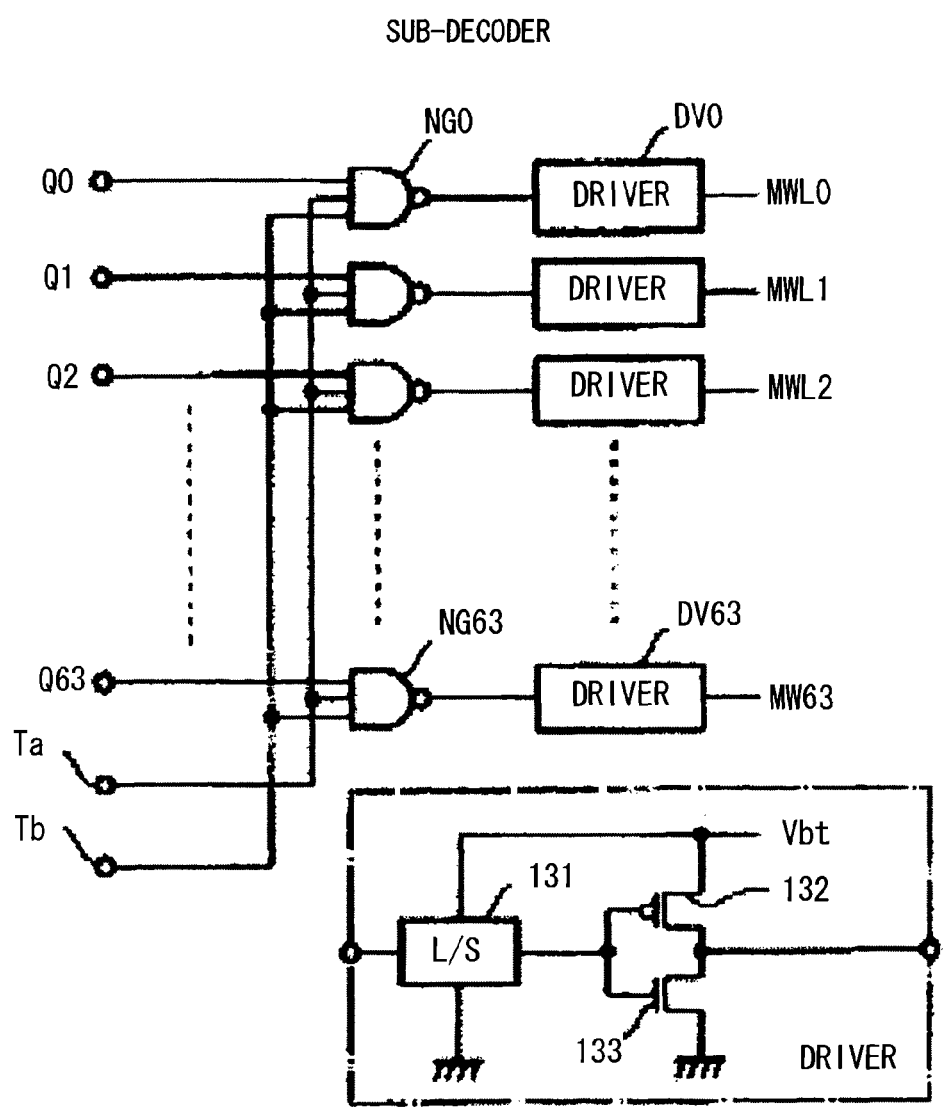
FIG. 13 shows a configuration of a word line selection circuit of a related art.
Figure 14:
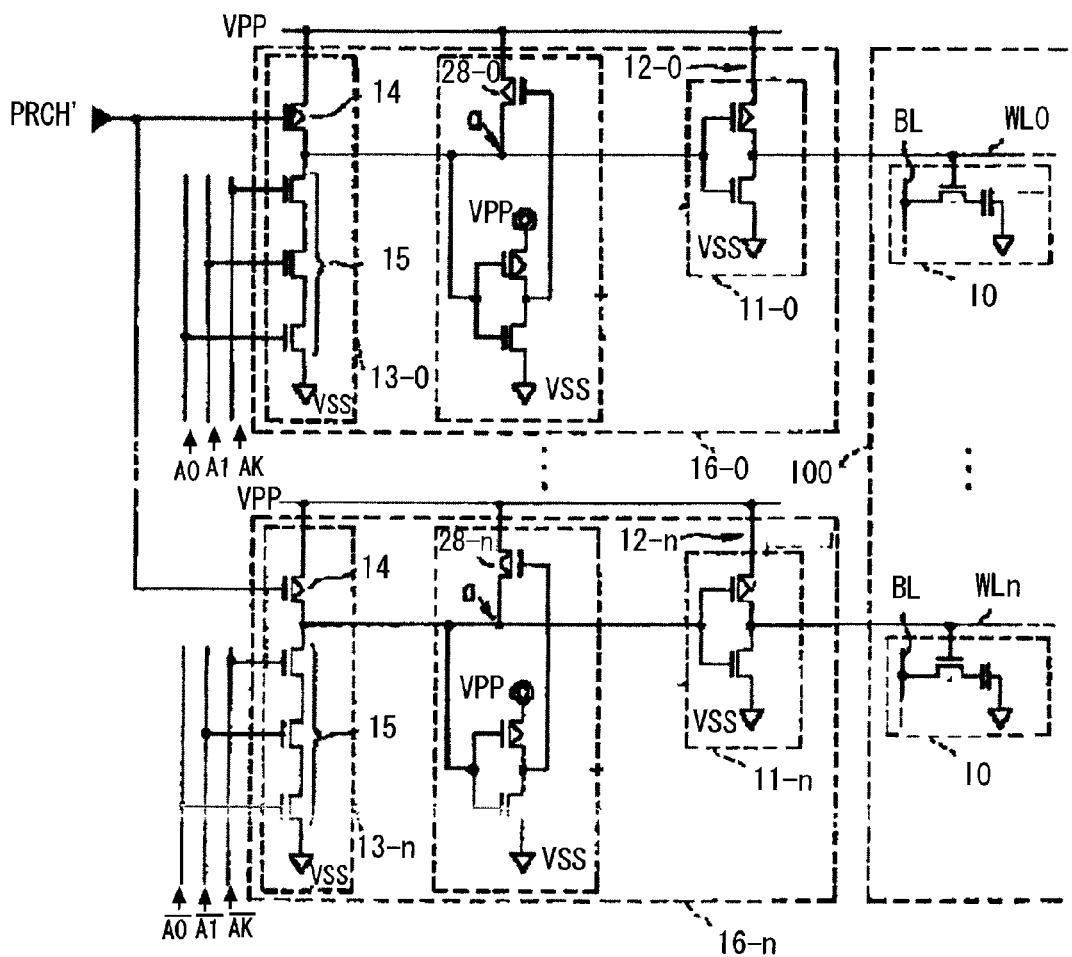
FIG. 14 shows a configuration of a word line selection circuit of a related art.

In the above-described third embodiment, the configuration in which the inverters 711 and 721 are added to the decoder 730 for the X3 is used as the configurations of the decoder 710 for the X1 and the decoder 720 for the X2. In contrast to this, as for a preceding stage row decoder 800, as shown in FIG. 11, the configuration of the word line selection circuit 100 may be employed as it is as configurations of a decoder 810 for the X1 and a decoder 820 for the X2, and the configuration having an inverter 831 added thereto may be used as a configuration of a decoder 830 for the X3.

The exemplary embodiments mentioned above can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicants' intent is to encompass equivalents of all claim elements, even if amended later during prosecution.

What is claimed is:
1. A word line selection circuit comprising:
  a final stage row decoder that receives first and second pre-decode signals, generates a decode signal, and has a control output node, first and second power supply nodes, and an inverter circuit that operates with a first power supply voltage, drives a word line, and has an input node connected to the control output node supplied with the decode signal, wherein the final stage row decoder comprises:

a variable resistance element coupled between the first power supply node and the control output node, the first power supply node supplied with the first power supply voltage, the variable resistance element responding to the first pre-decode signal, first and second transistors coupled in series between the control output node and the second power supply node, the second power supply node supplied with a second power supply voltage, the first transistor having a gate terminal supplied with the first pre-decode signal, the second transistor having a gate terminal supplied with the second pre-decode signal, wherein each of the first and second pre-decode signals having a voltage range between the second power supply voltage and a third power supply voltage, the third power supply voltage being less than the first power supply voltage.

2. The word line selection circuit according to claim 1, wherein the variable resistance element comprises a third transistor, the third transistor having a gate terminal supplied with the first pre-decode signal.

3. The word line selection circuit according to claim 2, wherein each of the first and second transistors has a first conductive type and the third transistor has a second conductive type which is different from the first conductive type.

4. The word line selection circuit according to claim 1, wherein the second power supply voltage is ground potential.

5. A semiconductor memory device comprising:

a row decoder that generates first and second pre-decode signals, the row decode being supplied with a first power supply voltage and a second power supply voltage, and;

a final stage row decoder that receives the first and second pre-decode signals, generates a decode signal, and is supplied with a third power supply voltage and a fourth power supply voltage, the third power supply voltage greater than the first power supply voltage, and an inverter circuit that drives a word line in response to the decode signal, and is supplied with the third power supply voltage and a fifth power supply voltage, wherein the final stage row decoder comprises:

a first power supply node supplied with the third power supply voltage;

a second power supply node supplied with the fourth power supply voltage;

a control output node connected to a input of the inverter circuit;

a variable resistance element coupled between the first power supply node and the control output node, the variable resistance element responding to the first pre-decode signal, first and second transistors coupled in series between the control output node and the second power supply node, the first transistor having a gate terminal supplied with the first pre-decode signal, the second transistor having a gate terminal supplied with the second pre-decode signal.

6. The semiconductor memory device according to claim 5, wherein the second power supply voltage is equal to the fourth power supply voltage, and is different in level from the fifth power supply voltage, and the fifth power supply voltage is less than the second power supply voltage.

7. The semiconductor memory device according to claim 5, wherein the second power supply voltage is different in level from the fourth power supply voltage, the fourth power supply voltage is equal to the fifth power supply voltage, and both of the fourth power supply voltage and fifth power supply voltage are less than the second power supply voltage.

8. The semiconductor memory device according to claim 6, wherein the second power supply voltage is ground potential.

* * * * *